(12) United States Patent
Vathulya

(10) Patent No.: US 6,636,119 B2
(45) Date of Patent: Oct. 21, 2003

(54) COMPACT CASCODE RADIO FREQUENCY CMOS POWER AMPLIFIER

(75) Inventor: Vickram Vathulya, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 57 days.

(21) Appl. No.: 09/745,620

(22) Filed: Dec. 21, 2000

(65) Prior Publication Data

US 2002/0079971 A1 Jun. 27, 2002

(51) Int. Cl.$^7$ .............................. H03F 3/04; H03F 3/14
(52) U.S. Cl. ...................... 330/311; 330/307; 330/296
(58) Field of Search ................................ 330/311, 307, 330/296

(56) References Cited

U.S. PATENT DOCUMENTS

| | | | | |
|---|---|---|---|---|
| 4,586,004 A | * | 4/1986 | Valdez ........................ | 326/110 |
| 5,043,639 A | * | 8/1991 | Gurley et al. ................ | 315/386 |
| 5,274,342 A | * | 12/1993 | Wen et al. ............... | 330/124 R |
| 5,440,276 A | * | 8/1995 | Kim ........................ | 331/117 D |

OTHER PUBLICATIONS

Muraguchi et al., "A Novel MMIC Power Amplifier for Pocket–Size Cellular telephones", IEEE MTT–S, 793–796, 1993.

* cited by examiner

*Primary Examiner*—Patricia Nguyen
(74) *Attorney, Agent, or Firm*—Michael E. Belk

(57) ABSTRACT

An integrated circuit chip includes a cascode amplifier having a first NMOS transistor with the gate receiving an input signal a source connected to ground through an inductance and a drain connected to the source of a second NMOS transistor. The drain of the second transistor is connected to a supply voltage through another inductance. The gate of the second transistor is connected to a DC bias voltage through a resistor and is connected to a first plate of an on-chip parallel plate capacitor. The other plate of the capacitor is connected to a wirebond pad for connection to a circuit board through a bond wire. The capacitor together with the inductance of the bond wire form a short circuit at the operating voltage of the amplifier.

10 Claims, 4 Drawing Sheets

COMPACT CASCODE RADIO FREQUENCY CMOS POWER AMPLIFIER

FIELD OF THE INVENTION

The present invention relates to the field of Cascode Radio Frequency Power Amplifiers.

BACKGROUND OF THE INVENTION

In the art of radio frequency (RF) power amplifiers (PA) cascode stages are used to suppress Miller capacitance and improve the gain and frequency response of analog circuits. They provide high gain and efficiency over a broad range of input power conditions. These amplifiers are often used in transceiver systems where high power output is required. In such transceivers, the cascode stages often contain multiple transistors connected in parallel to provide high power amplification.

In an bipolar implementation of a cascode RF PA for a transceiver, the transistors of a first stage are connected in a common-emitter (CE) configuration and the transistors of a second stage are connected in a common-base (CB) configuration. Such systems are described in U.S. Pat. No. 5,274,342 to Wen. In that patent, multiple parallel transistors are provided in each stage and the output of each CE stage transistor is connected to only the input of a respective transistor of the CB stage. Thus, each pair of CE and CB connected transistors act as a separate amplifier in parallel with other separate amplifiers to reduce in-phase signal delay mismatch and prevent thermal runaway if one of the transistors heats up more than the other transistors.

Those skilled in the art are directed to "A Novel MMIC Power Amplifier for Pocket-Size Cellular Telephones" by Masahiro Muraguchi et. al., IEEE MTT-S, 793–796, 1993.

The above citations are hereby incorporated in whole by reference.

SUMMARY OF THE INVENTION

In the invention herein, an CMOS integrated circuit chip has a cascode RF PA with a first cascode stage of one or more first transistors connected in parallel, and a second stage of one or more second transistors connected in parallel. The inputs of the second stage transistors are connected in series to the outputs of the respective first stage transistors. The inputs of the first stage transistors are connected to ground and the outputs of the second stage transistors are connected to a reference voltage through an impedance. An RF input signal is provided to the gates of the first stage transistors and a signal output is provided from the output of the second transistors. A bias voltage is connected through an impedance to the gates of the second transistors. The use of two stages reduces the peak voltage between the gates and the inputs and outputs of the respective transistors so that gate oxide is not ruptured.

In a MOSFET implementation, the connection configuration described above for the first transistor, is referred to as common gate configuration and thus the first stage is referred to as the common gate stage. Similarly for MOSFET circuits the connection configuration described above for the second transistor, is referred to as common source configuration and thus, the second stage of the PA is called the common source stage.

The gates of the second transistors are connected to ground through a series combination of a small on-chip capacitor and an off-chip inductance to provides a well controlled resonant short circuit at the operating frequency. This termination cancels the impedance at the gate so as to suppress the occurrence of negative resistance at the gates of the second transistors by eliminating the feedback from the output of the second transistors to the gates of the second transistors. This also provides a compact implementation with minimal parasitic effects and unwanted oscillations.

In a wirebond implementation, the off-chip inductances may be provided by bond wires connected to bond pads connected to the on-chip capacitors. In a flip chip implementation, the inductances may be provided by inductive traces of the circuit board or by external wire coils connected through a flip-chip joint to the on-chip capacitors. Preferably, the size and/or number of on-chip capacitors and corresponding off-chip inductances are selected to provide a well controlled resonant short circuit at the first harmonic of the operating frequency to further suppress negative resistance of the CG stage.

Preferably, the transistors are metal-on-silicon field-effect transistors (MOSFETs), and more preferably NMOS transistors. The use of a two stage amplifier prevents gate rupture in deep submicron CMOS ICs (e.g. for 0.25 micron CMOS technology, gate rupture will occur at 6V, which can easily be exceeded between the gate and drain terminals in a PA, during RF operation, with a supply voltage as low as 2.5V). The invention allows the use of a pure CMOS design thereby minimizing the cost of the transceiver. Also, preferably, an on-chip resistance is provided for the bias input of the gate of the CG stage to limit the current to the gate.

Those skilled in the art will understand the invention and additional objects and advantages of the invention by studying the description of preferred embodiments below with reference to the following drawings which illustrate the features of the appended claims:

DETAILED DESCRIPTION OF PREFERRED EMBODIMENTS INCLUDING THE BEST MODE

Figure 1:
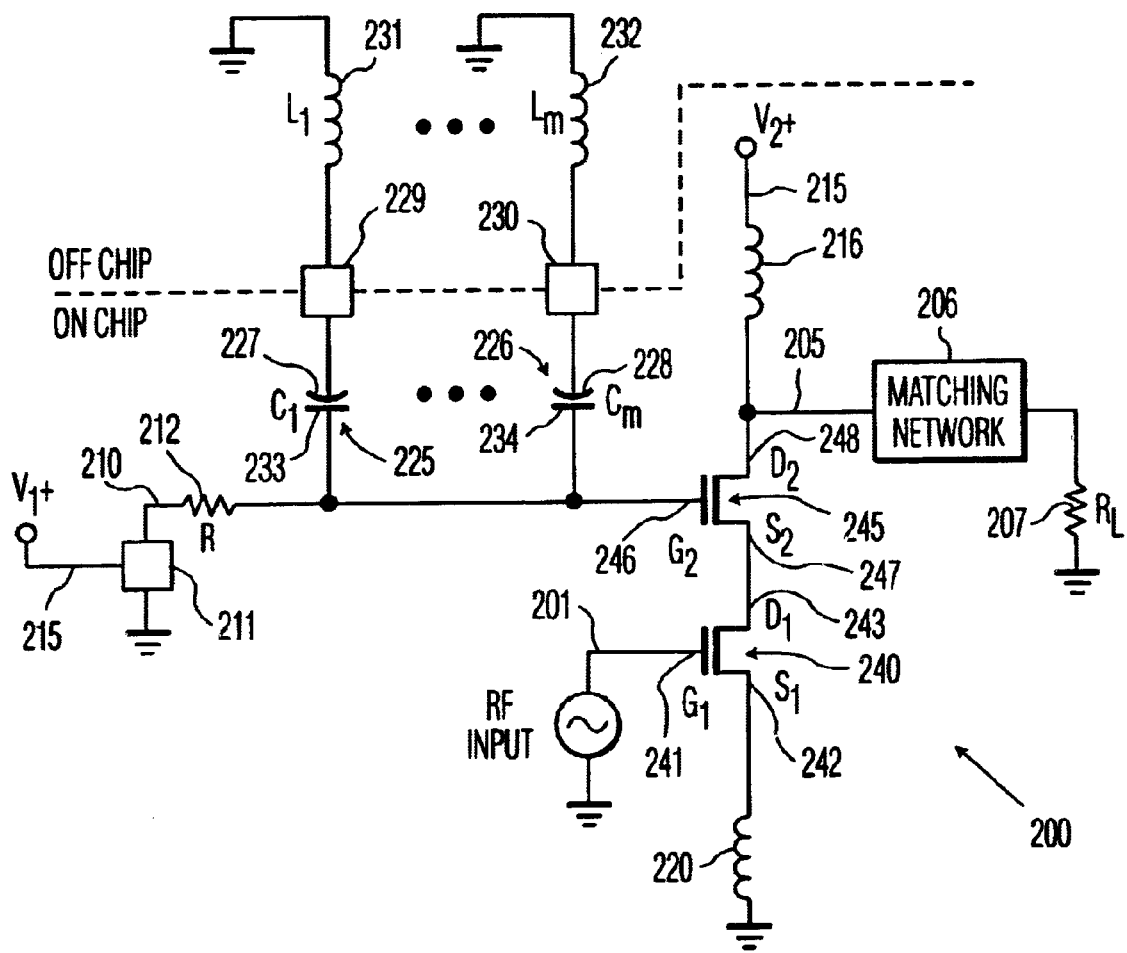
FIG. 1 illustrates a portion of an integrated circuit chip with a cascode power amplifier of the invention.

FIG. 1 shows a schematic of a portion of a CMOS integrated circuit chip 200 with a radio frequency (RF) cascode power amplifier (PA) of the invention. An input signal path 201 provides a RF signal to the PA and an output signal path 205 transmits an amplified RF signal output from the PA. The input signal may originate on the chip or may originate off the chip and be conducted through bond wires from a circuit board onto the chip. The output signal is transmitted from the PA through a circuitry providing a matching network 206 and a resistance load 207. Again the matching network and load resistance may be on or off the chip. A DC bias voltage path 210 provides a bias voltage to the PA and a reference voltage path 215 provides a reference voltage to the PA. The reference voltage is supplied from the circuit board through bond wires (see FIG. 2). A ground path 220 provides a different reference voltage to the PA. Herein, the term ground simply means a second reference voltage with a different voltage level than the reference voltage provided through reference voltage path 215. The bias voltage has a voltage level that is intermediate the ground and reference voltage levels.

The a RF cascode PA, includes one or more on-chip parallel-plate capacitors 225, 226, each capacitor includes a first respective plate 227, 228 connected to a separate respective connector 229, 230 for connection to a ground of a circuit board through a respective inductance 231, 232. For a wirebond chip, the connectors 229, 230 may be wirebond pads on the chip surface and the respective inductances 227, 228 may be bond wires. For a flip-chip, the connectors 229, 230 may be connection pads for flip chip joints and the respective inductances 227, 228 may be an inductive trace on a circuit board, or discrete inductors such as wire coils. Each on-chip capacitor 225, 226 also includes a second respective capacitor plate 233, 234 connected to voltage path 210.

The PA also includes a first MOS transistor 240 with a gate 241 controlling the current between a first terminal 242 and a second terminal 243 of the first transistor. The first terminal of the first transistor is connected to the ground path 220 and the gate of the first transistor is connected to the input signal path 201 for receiving an RF input signal.

The PA further includes a second MOS transistor 245 with a gate 246 controlling the current between a first terminal 247 and a second terminal 248 of the second transistor. The first terminal of the second transistor is connected to the second terminal of the first MOS transistor. Also, the second terminal of the second transistor is connected to the output path 205 and is connected to the reference voltage path 215 through a pull-up inductor 216. The gate of the second transistor is connected to the second plate of each on-chip parallel-plate capacitor and connected to the bias voltage path 210 through a current limiting element 212.

Preferably, current limiting element 212 is an on-chip resistor connected between the gate of the second transistor and the bias voltage path. Pull-up inductor 216 provides for the drain voltage to reach a value approximately equal to the supply voltage for RF amplification. The pull-up inductor 216 may be provided on the chip or off the chip. For example, the inductor may be provided as an inductive trace on the chip or circuit board or as a wire coil connected to the circuit board or as a bonding wire between the circuit board and the chip. The bias voltage may be provided on the chip from the reference voltage by a voltage divider 212 or may be provided through bond wires from the circuit board as described below with reference to FIG. 2.

Also preferably, the integrated circuit is a CMOS circuit and the first and second transistors are MOSFET transistors of the NMOS type, so that, the first terminals are source terminals and the second terminals are drain terminals of the first and second transistors. Alternately, the transistors may be PMOS transistors in which the first terminals are drain terminals and the second terminals are source terminals of the first and second transistors. Furthermore, the invention may be implemented using bipolar transistors. In that case, the gates are the bases of the transistors and for NPN transistors, the first terminals are emitters are the second terminals are collectors and vice versa for PNP transistors. The first transistor 240 is the first stage of the cascode amplifier and the second transistor 245 is the second stage of the cascode amplifier. The first stage may include a plurality of first transistors, each with a respective gate connected to the same input signal path, and the second stage may include a plurality of second transistors, each with its drain connected to the amplified signal output path, the outputs of the first transistors connected to the inputs of the second transistors.

Only one, of the two on-chip capacitors shown, may be required, depending on the specific technology used to produce the amplifier chips of the invention. Preferably however, there are a plurality of on-chip parallel-plate capacitors each with a first plate connected to a different respective wirebond pad and a second plate connected to the gate of the second transistor. The ellipses between the capacitors in FIG. 1 indicate that one or more additional capacitors may be provided. Also, preferably, the on-chip capacitors have a combined capacitance selected to form a resident short circuit at the operating frequency to reduce negative impedance with respect to the input signal at the gate of the second transistor at a low frequency; and another one or more of the on-chip capacitors have a capacitance selected to form an harmonic circuit to reduce negative impedance with respect to the input signal at the gate of the second transistor of the low frequency.

NMOSFET transistors are shown and described for FIG. 1, but those skilled in the art will know how to substitute PMOSFET transistors by reversing the polarity of the circuit. Furthermore, those skilled in the art will know how to substitute PNP or NPN bipolar transistors for the NMOS transistors.

Figure 2:
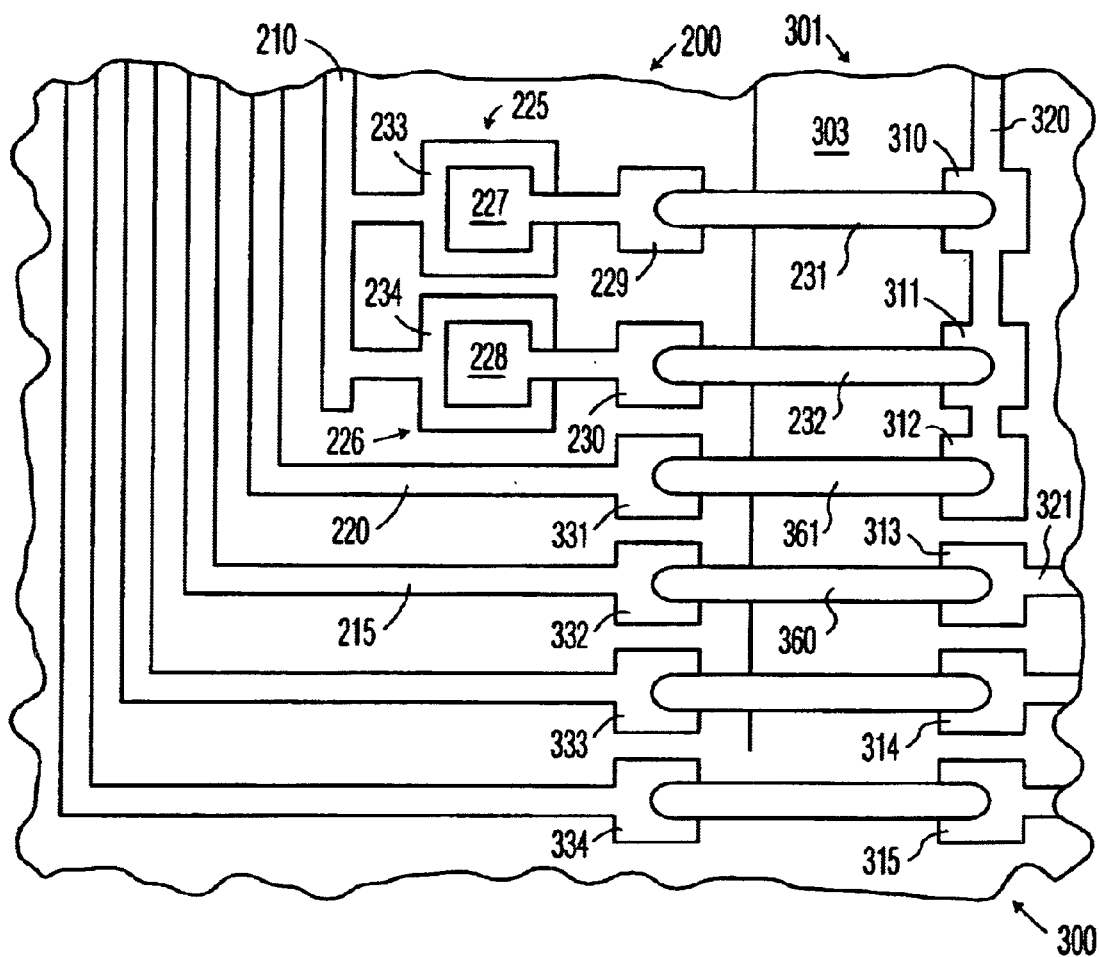
FIG. 2 shows a portion of a circuit board assembly with a portion of the integrated circuit chip of FIG. 1 connected to a circuit board substrate.

FIG. 2 illustrates a portion of a circuit board assembly 300 of the invention including a portion of a circuit board 301 and a portion of an integrated circuit 200 of FIG. 1. The circuit board includes a layer of insulating material 303 on which a plurality of wirebond pads 310–315 are arranged. A ground path 320 of the circuit board interconnects wirebond pads 310, 311 and 312 on the circuit board. A reference voltage path 321 is connected to a second wirebond pad 313 of the circuit board.

The integrated circuit chip 200 of FIG. 1 is mounted on the circuit board to form the circuit board assembly and the chip includes a plurality of wirebond pads 331–334 and 229–230 on a surface of the chip. Bond wire 360 connects between wirebond pad 332 on the circuit board surface and wirebond pad 313 on the circuit board surface to connect reference voltage path 321 of the circuit board with reference voltage path 215 on the chip. Bond wire 361 connects between wirebond pad 312 on the circuit board surface and the wirebond pad 331 on the chip surface to connected ground path 220 of the chip to ground path 320 of the circuit board. As described above in reference to FIG. 1, on-chip parallel-plate capacitors 225, 226 each have a first respective plate 227, 228 connected to a separate respective wirebond pad 229, 230 on a surface of the chip; and each have a second respective plate 233, 234 connected to bias voltage path 210 through resistor 212. Bond wires 231, 232 connect between wirebond pads 229, 230 on the chip surface and wirebond pads 310, 311 on the substrate surface which are connected to ground path 320.

Figure 3:
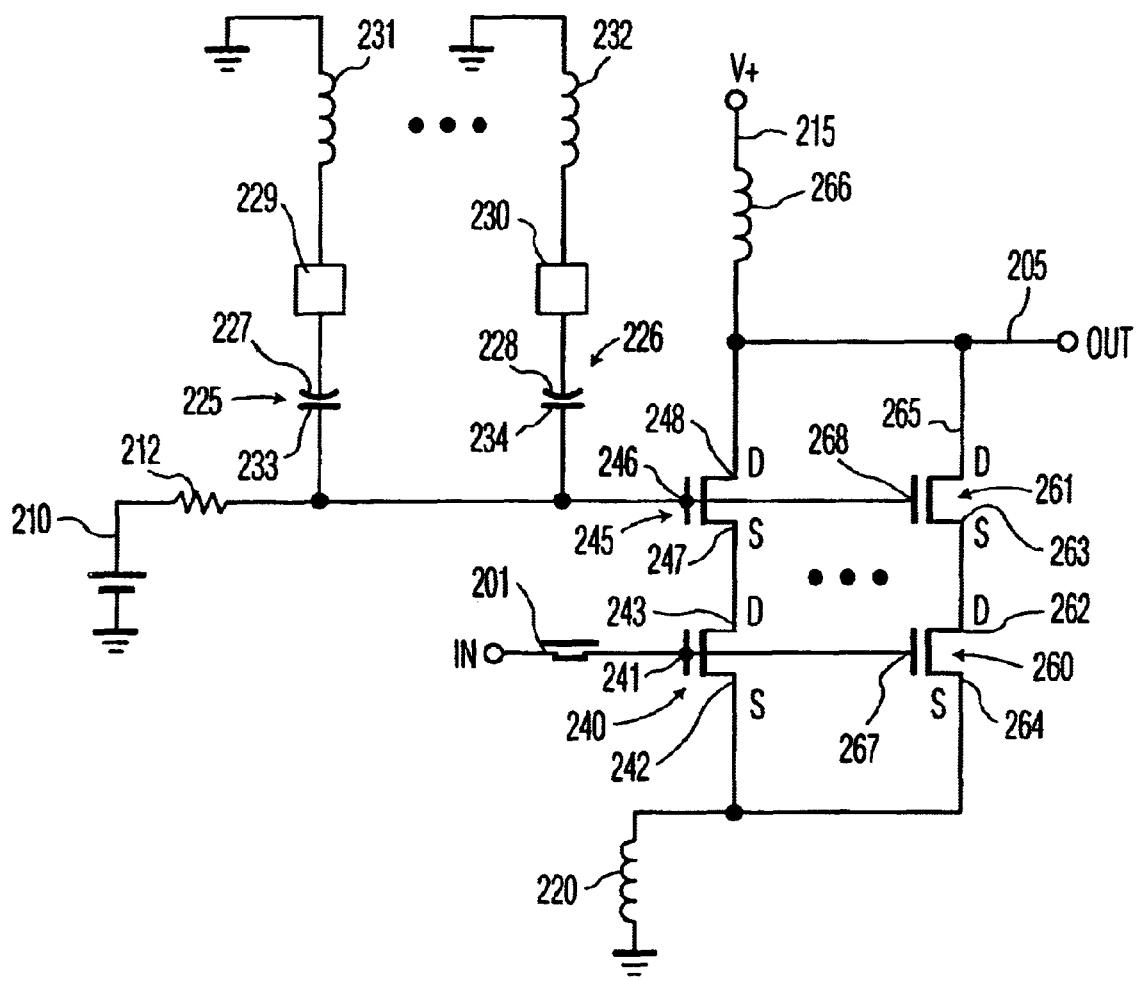
FIG. 3 illustrates another embodiment of the cascode power amplifier of FIG. 1.

FIG. 3 illustrates a specific embodiment of the cascode PA of the invention which is similar to the embodiment of FIGS. 1 and 2, but with multiple transistors in each cascode stage. For a first pair of transistors 240, 245, drain terminal 243 of a first transistor 240 is connected to source terminal 247 of a second transistor 245. Similarly for a second pair of transistors 260, 261, drain terminal 262 of a first transistor 260 is connected to source terminal 236 of a second transistor 261. Source terminal 242 of transistor 240 is connected to source terminal 264 of transistor 260 and to ground through a pull-down inductor. Drain terminal 248 of transistor 245 is connected to drain terminal 265 of transistor 261 and to signal output path 205 and to reference voltage input path 215 through pull-up inductor 266. Thus, each pair of transistors are connected to each other in series and connected to other pairs of transistors in parallel.

The gate terminals 241, 267 of first transistors 240, 260 respectively are connected together and to input signal path 201. The gate terminals 246, 268 of second transistors 245, 261 respectively are connected together and to bias voltage path 210 through on-chip resistor 212, and are connected to first plates 233, 234 respectively of on-chip capacitors 225 and 226 respectively. As in FIG. 1, second plates 227, 228 of capacitors 225, 226 respectively are connected to different respective wirebond pads 229, 230 for connection to a circuit board through different respective bond wires 231, 232.

The ellipses ". . . " between the first and second transistor pairs indicate that additional pairs of transistors connected in the same way, may also be provided.

Figure 4:
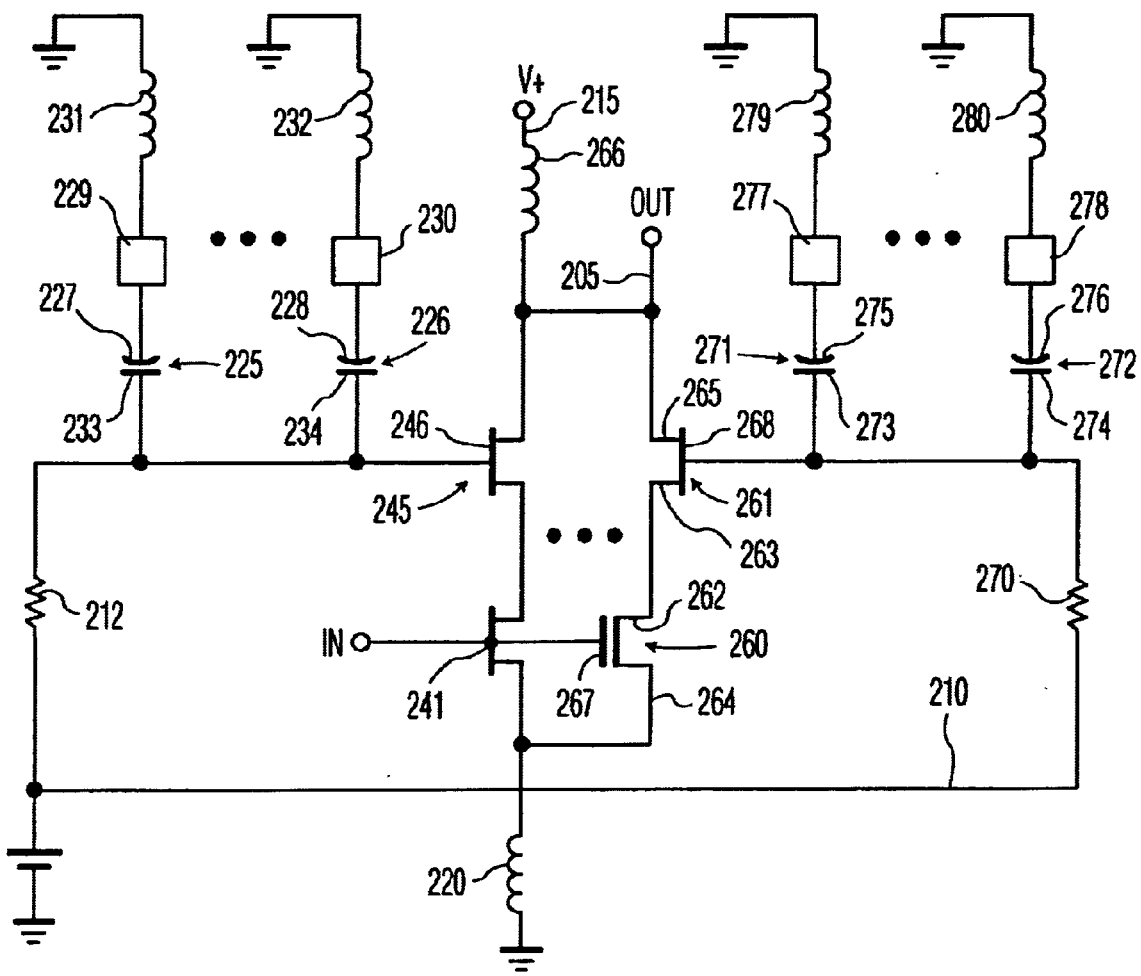
FIG. 4 illustrates yet another embodiment of the cascode power amplifier of FIG. 1.

FIG. 4 shows another specific embodiment of the invention similar to the embodiment of FIG. 3, in which the gates 246, 268 of transistors 245, 261 are not connected directly to each other. Gate 246 of transistor 245 is connected to bias voltage path 210 through on-chip resistor 212 and also connected to the first plates 233, 234 of respective on-chip capacitors 225, 226. Gate 268 of transistor 261 is connected to bias voltage path 210 through on-chip resistor 270 and also connected to the first plates 273, 274 of respective on-chip capacitors 271, 272.

Figure 5:
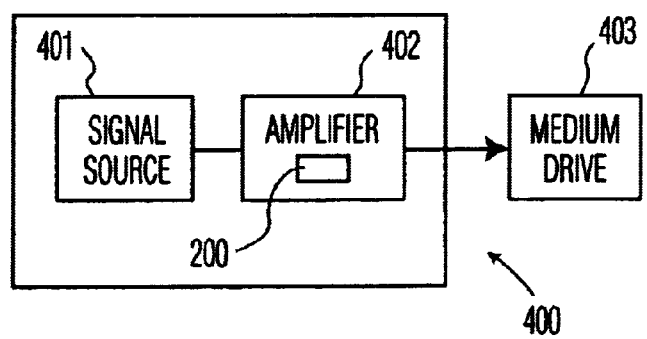
FIG. 5 shows a transmitter of the invention.

FIG. 5 illustrates the transmitter 400 of the invention. The transmitter may be a transmitter for terrestrial or satellite broadcasting of radio frequency electromagnetic signals from an antenna such as a hand-held radio (e.g. a cellular phone) or a storage device such as an optical disk drive or magnetic hard drive; or a laser transmitter of a telephone, cable television, or similar optical broadband network through optical fibers; or a transmitter of electronic signals through wires, for example, between computer devices, or any other know use of radio frequency signals.

The transmitter includes a signal source 401 such as a microphone or an optical disk drive or any other sources of signals to be broadcast. The signal from the source is amplified by amplifier 402 including the integrated circuit chip 200 as described above in relation to FIGS. 1 and 2. The amplified signal is provided to a transmitter 403 for transmission onto a medium. For example, an electrical connection transmitting through wires, an optical disk drive writing to an optical disk, an antenna broadcasting through airwaves, or a laser transmitter transmits through optical fibers.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

I claim:

1. An integrated circuit chip, comprising:
   an input signal path;
   an amplified output signal path;
   a DC bias voltage path;
   a reference voltage path;
   a ground path;
   a radio frequency cascode power amplifier, including:
      one or more on-chip parallel-plate capacitors, each capacitor having a first plate connected to a different respective interconnect terminal for communication through an inductive element to a ground path on a circuit board and each capacitor having a second plate;
      a first transistor with a first transistor control terminal controlling the current between a first transistor first terminal and a first transistor second terminal with the first transistor first terminal connected to the ground path and the first transistor control terminal connected to the input signal path for receiving a radio frequency input signal; and
      a second transistor with a second transistor control terminal controlling the current between a second transistor first terminal and a second transistor second terminal with the second transistor first terminal connected to the first transistor second terminal, the second transistor second terminal connected to the amplified output signal path and connected to the reference voltage path through a pull-up inductor, and the second transistor control terminal connected to the second plates of the on-chip parallel-plate capacitors and connected to the bias voltage path through a current limiting element.

2. The chip of claim 1, in which:
   the integrated circuit includes a GaAs substrate;
   the current limiting element is an on-chip resistor;
   the chip further comprises means for supplying the bias voltage from the reference voltage path;
   the integrated circuit is a CMOS circuit the first and second transistors are MOSFET transistors and the control terminals are gates of the MOSFET transistors:
   the first and second transistors are both NMOS transistors and for both transistors, the first terminal is a source terminal and the second terminal is a drain terminal;
   there are a plurality of on-chip parallel-plate capacitors each with a first plate connected to a different respective interconnect terminal and a second plate connected to the second transistor control terminal;
   the interconnect terminals include wirebond pads;
   one of the on-chip capacitors has a capacitance selected to form a resident short circuit at the operating frequency to reduce negative impedance with respect to the input signal at the gate of the second transistor at a low frequency; and
   another one of the on-chip capacitors has a capacitance selected to form an harmonic circuit to reduce negative impedance with respect to the input signal at the gate of the second transistor of the low frequency;
   there are a plurality of first transistors, each with a respective control terminal connected to the input signal path, and a plurality of second transistors, each with a second terminal connected to the amplified signal output path, the second terminals of the first transistors are connected to respective first terminals of the second transistors.

3. A circuit board assembly comprising:
   a circuit board;
   a ground path of the circuit board connected to a first interconnect terminal and a third interconnect terminal of the circuit board;

a reference voltage path of the circuit board connected to a second interconnect terminal of the circuit board; and an integrated circuit chip mounted on the circuit board and including:
an input signal path;
an amplified output path;
a ground path of the chip connected to a first interconnect terminal on the chip surface;
a reference voltage path of the chip connected to a second interconnect terminal on the chip surface;
a DC bias voltage path;
one or more on-chip parallel-plate capacitors, each capacitor having a first plate connected to a different third interconnect terminal on the surface of the chip and each capacitor having a second plate;
a first transistor with a first transistor control terminal controlling the current between a first transistor first terminal and a first transistor second terminal, with the first transistor first terminal connected to the ground path of the chip and the first transistor control terminal connected to the input signal path for receiving a radio frequency input signal;
a second transistor with a second transistor control terminal controlling the current between a second transistor first terminal and a second transistor second terminal with the second transistor first terminal connected to the first transistor second terminal, the second transistor second terminal connected to the amplified signal output path and to the reference voltage path through a pull-up inductor, and the second transistor control terminal connected to the second plate of each on-chip parallel-plate capacitor and to the bias voltage path; and
a current limiting element through which the bias voltage path is connected to the control terminal of the second transistor;

the assembly further comprising:
a first conductor connecting between the first interconnect terminal of the circuit board surface and the first interconnect terminal on the chip surface for providing the ground potential to the chip;
a second conductor connecting between the second interconnect terminal of the circuit board surface and the second interconnect terminal on the chip surface for providing the reference potential to the chip; and
one or more third conductors each connecting between a corresponding one of the third interconnect terminals of the circuit board surface and a corresponding one of the third interconnect terminals on the chip surface;
and wherein a respective inductive element is connected between each first plate of a corresponding on-chip parallel plate capacitor and the ground path of the circuit board.

4. The assembly of claim 3, in which:
the third interconnect terminals of the circuit board and the third interconnect terminals of the chip are wirebond pads and the third conductors are bond wires which provide the inductive element connected between the first plate of each capacitor and the ground path on the circuit board;
the integrated circuit includes a GaAs substrate;
the current limiting element is an on-chip resistor;
the chip further comprises means for supplying the bias voltage from the reference voltage path;
the integrated circuit is a CMOS circuit, the first and second transistors are MOSFET transistors, and the control terminals are gates of the transistors:

the first and second transistors are both NMOS transistors and the first terminals are source terminals and the second terminals are drain terminals;
there are a plurality of on-chip parallel-plate capacitors each with a first plate connected to a different respective wirebond pad and a second plate connected to the control terminal of the second transistor;
one of the on-chip capacitors has a capacitance selected to form in combination with the respective bond wire to which it is connected, a resident short circuit at the operating frequency to reduce negative impedance with respect to the input signal at the control terminal of the second transistor at a low frequency;
another one of the on-chip capacitors has a capacitance selected to form in combination with the respective bond wire to which it is connected, an harmonic circuit to reduce negative impedance with respect to the input signal at the control terminal of the second transistor of the low frequency; and
there are a plurality of first transistors, each with a respective control terminal connected to the input signal path, and a plurality of second transistors, each with a second terminal connected to the amplified signal output path, the second terminals of the first transistors connected to the first terminals of the second transistors.

5. A transmitter using the integrated circuit chip of claim 1, comprising:
means for providing a radio frequency input signal;
means for amplifying the input signal to provide an amplified output signal; and
means for transmitting the amplified output signal onto a transmission medium;
and in which, the amplifying means includes an integrated circuit chip comprising:
an input signal path;
an amplified output signal path;
a DC bias voltage path;
a reference voltage path;
a ground path;
a radio frequency cascode power amplifier, including:
one or more on-chip parallel-plate capacitors, each capacitor having a first plate connected to a different respective interconnect terminal for communication through a respective inductive element to a ground path on a circuit board and each capacitor having a second plate;
a first transistor with a first transistor control terminal controlling the current between a first transistor first terminal and a first transistor second terminal with the first transistor first terminal connected to the ground path and the first transistor control terminal connected to the input signal path for receiving the radio frequency input signal; and
a second transistor with a second transistor control terminal controlling the current between a second transistor first terminal and a second transistor second terminal with the second transistor first terminal connected to the first transistor second terminal, the second transistor second terminal connected to the amplified output signal path and to the reference voltage path through a pull-up inductor, and the second transistor control terminal connected to the second plates of the on-chip parallel-plate capacitors and to the bias voltage path through a current limiting element.

6. An integrated circuit chip, comprising:
an input signal path;
an amplified output signal path;
a DC bias voltage path;
a reference voltage path;
a ground path;
a radio frequency cascade power amplifier, including:
one or more on-chip parallel-plate capacitors, each capacitor having a first plate communicating with a different respective interconnect terminal for communication through an inductive element to a ground path on a circuit board and each capacitor having a second plate;
a first transistor with a first transistor control terminal controlling the current between a first transistor first terminal and a first transistor second terminal with the first transistor first terminal communicating with the ground path and the first transistor control terminal communicating with the input signal path for receiving a radio frequency input signal; and
a second transistor with a second transistor control terminal controlling the current between a second transistor first terminal and a second transistor second terminal with the second transistor first terminal communicating with the first transistor second terminal, the second transistor second terminal also communicating with the amplified output signal path and communicating with the reference voltage path through a pull-up inductor, and the second transistor control terminal communicating with the second plates of the on-chip parallel-plate capacitors and communicating with the bias voltage path through a current limiting element.

7. The chip of claim 6, in which:
the integrated circuit includes a GaAs substrate;
the current limiting element is an on-chip resistor;
the chip further comprises means for supplying the bias voltage from the reference voltage path; and
the integrated circuit is a CMOS circuit the first and second transistors are MOSFET transistors and the control terminals are gates of the MOSFET transistors:
the first and second transistors are both NMOS transistors and for both transistors, the first terminal is a source terminal and the second terminal is a drain terminal;
there are a plurality of on-chip parallel-plate capacitors each with a first plate connected to a different respective interconnect terminal and a second plate connected to the second transistor control terminal;
the interconnect terminals include wirebond pads;
one of the on-chip capacitors has a capacitance selected to form a resident short circuit at the operating frequency to reduce negative impedance with respect to the input signal at the gate of the second translator at a low frequency;
another one of the on-chip capacitors has a capacitance selected to form an harmonic circuit to reduce negative impedance with respect to the input signal at the gate of the second transistor of the low frequency; and
there are a plurality of first transistors, each with a respective control terminal connected to the input signal path, and a plurality of second transistors, each with a second terminal connected to the amplified signal output path, the second terminals of the first transistors are connected to respective first terminals of the second transistors.

8. A circuit board assembly comprising:
a circuit board;
a ground path of the circuit board;
a reference voltage path of the circuit board; and
an integrated circuit chip mounted on the circuit board and including:
an input signal path;
an amplified output signal path;
a ground path of the chip communicating with the ground path of the circuit board;
a reference voltage path of the chip communicating with the reference voltage path of the circuit board;
a DC bias voltage path;
one or more on-chip parallel-plate capacitors, each capacitor having a first plate communicating with the ground path of the circuit board and each capacitor having a second plate;
a first transistor with a first transistor control terminal controlling the current between a first transistor first terminal and a first transistor second terminal with the first transistor first terminal communicating with the ground path and the first transistor control terminal communicating with the input signal path for receiving a radio frequency input signal;
a second transistor with a second transistor control terminal controlling the current between a second transistor first terminal and a second transistor second terminal with the second transistor first terminal communicating with the first transistor second terminal, the second transistor second terminal communicating with the amplified signal output path and with the reference voltage path through a pull-up inductor, and the second transistor control terminal communicating with the second plate of each on-chip parallel-plate capacitor; and
a current limiting element connected in the communication between the bias voltage path and the second transistor control terminal;
and wherein a responsive inductive element is connected in the communication between the first plate of each on-chip parallel plate capacitor and the ground path of the circuit board.

9. The assembly of claim 8, in which:
the third interconnect terminals of the circuit board and the third interconnect terminals of the chip are wirebond pads and the third conductors are bond wires which provide the inductive element connected between the first plate of each capacitor and the ground path on the circuit board;
the integrated circuit includes a GaAs substrate;
the current limiting element is an on-chip resistor;
the chip further comprises means for supplying the bias voltage from the reference voltage path;
the integrated circuit is a CMOS circuit, the first and second transistors are MOSFET transistors, and the control terminals are gates of the transistors:
the first and second transistors are both NMOS transistors and the first terminals are source terminals and the second terminals are drain terminals;
there are a plurality of on-chip parallel-plate capacitors each with a first plate communicating with a different respective wirebond pad and a second plate communicating with the control terminal of the second transistor;

one of the on-chip capacitors has a capacitance selected to form in combination with the respective bond wire to which it is connected, a resident short circuit at the operating frequency to reduce negative impedance with respect to the input signal at the control terminal of the second transistor at a low frequency;

another one of the on-chip capacitors has a capacitance selected to form in combination with the respective bond wire to which it is connected, an harmonic circuit to reduce negative impedance with respect to the input signal at the control terminal of the second transistor of the low frequency; and there are a plurality of first transistors, each with a respective control terminal communicating with the input signal path, and a plurality of second transistors, each with a second terminal communicating with the amplified signal output path, the second terminals of the first transistors communicating with the first terminals of the second transistors.

10. A transmitter using the integrated circuit chip of claim 6, comprising:

means for providing an input signal;

means for amplifying the input signal; and means for transmitting the amplified signal onto a transmission medium;

and in which, the amplifying means includes an integrated circuit chip comprising:
an input signal path;
an amplified output signal path;
a DC bias voltage path;
a reference voltage path;
a ground path;
a radio frequency cascode power amplifier, including:
one or more on-chip parallel-plate capacitors, each capacitor having a first plate communicating with a different respective interconnect terminal for communication through an inductive element to a ground path on a circuit board and each capacitor having a second plate;
a first transistor with a first transistor control terminal controlling the current between a first transistor first terminal and a first transistor second terminal with the first transistor first terminal communicating with the ground path and the first transistor control terminal communication with the input signal path for receiving a radio frequency input signal; and
a second transistor with a second transistor control terminal controlling the current between a second transistor first terminal and a second transistor second terminal with the second transistor first terminal communicating with the first transistor second terminal, the second transistor second terminal communicating with the amplified output signal path and communicating with the reference voltage path through a pull-up inductor, and the control terminal communicating with the second plates of the on-chip parallel-plate capacitors and communicating with the bias voltage path through a current limiting element.

* * * * *